United States Patent
Hirano et al.

(10) Patent No.: US 7,224,237 B2
(45) Date of Patent: May 29, 2007

(54) MODULATOR AND CORRECTION METHOD THEREOF

(75) Inventors: Shunsuke Hirano, Yokohama (JP); Yasunori Miyahara, Ayase (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 114 days.

(21) Appl. No.: 10/531,050

(22) PCT Filed: Jan. 8, 2004

(86) PCT No.: PCT/JP2004/000061

§ 371 (c)(1),
(2), (4) Date: Apr. 12, 2005

(87) PCT Pub. No.: WO2004/093309

PCT Pub. Date: Oct. 28, 2004

(65) Prior Publication Data

US 2006/0055466 A1   Mar. 16, 2006

(30) Foreign Application Priority Data

Jan. 8, 2003   (JP) ............................. 2003-002501

(51) Int. Cl.
*H03C 3/00* (2006.01)
*H03L 7/06* (2006.01)
*H03L 27/20* (2006.01)

(52) U.S. Cl. ........................................ 332/103; 331/16
(58) Field of Classification Search ........ 332/103–105; 331/16
See application file for complete search history.

(56) References Cited

U.S. PATENT DOCUMENTS 6,008,703 A   12/1999  Perrott et al.
6,833,767 B1 * 12/2004 Huff et al. ..................... 331/17
6,834,084 B2 * 12/2004 Hietala ......................... 375/296
7,075,376 B1 *  7/2006 Huff et al. ..................... 331/23
2004/0041638 A1 * 3/2004 Vilcocq et al. ............... 331/16

FOREIGN PATENT DOCUMENTS

| FR | 2 809 890 | 12/2001 |
| JP | 6-326518 | 11/1994 |
| JP | 9-289447 | 11/1997 |
| JP | 2001-156629 | 6/2001 |
| JP | 2002-207527 | 7/2002 |

OTHER PUBLICATIONS

Perrott et al., A 27-mW CMOS Fractional -N Synthesizer Using Digital Compensation for 2.5-Mb/s GFSK Modulation, Dec. 1997, pp. 2048-2060 (Cited on ESR-English Text).

* cited by examiner

*Primary Examiner*—David Mis
(74) *Attorney, Agent, or Firm*—Pearne & Gordon LLP

(57) ABSTRACT

The invention concerns a wideband modulator using a PLL synthesizer, which can match the frequency characteristic and prevent degradation in modulation accuracy even in the presence of a variation in the manufacture of circuit components. In a wideband modulator which modulates the division ratio of a frequency divider by using a modulating signal generated by a modulating signal generator and outputs a modulated carrier signal from a VCO, calibration data from a calibration data generator are input via a selector. The amplitude value of an ac component of each modulating signal, either appearing on the output of a loop filter or demodulated by a demodulator, is converted to a digital value by way of an A/D converter. The difference between the two is detected and a control signal FCR to eliminate the difference is generated in order to correct the frequency characteristic of a PLL or a pre-distortion filter.

20 Claims, 14 Drawing Sheets

A: FREQUENCY CHARACTERISTIC OF PLL
B: FREQUENCY CHARACTERISTIC OF DIGITAL COMPENSATION FILTER
C: FREQUENCY CHARACTERISTIC OBTAINED AFTER SYNTHESIS

MODULATOR AND CORRECTION METHOD THEREOF

TECHNICAL FIELD

The present invention relates to a modulator which is used in a radio unit and which generates and outputs a modulated carrier signal in a wider frequency range than a frequency range of a PLL thus performing wideband modulation using a PLL frequency synthesizer, and a correction method therefor.

BACKGROUND OF THE INVENTION

In general, a modulator circuit using a PLL synthesizer is required to be low cost, low power consumption as well as good noise characteristic and modulation accuracy. In PLL-based modulation, to provide a better modulation accuracy, it is desirable to provide a wider frequency range of a PLL (PLL bandwidth) rather than a frequency range of a modulating signal (modulation bandwidth). However, there is a problem that, broadening the PLL bandwidth fails to suppress a noise from each component of the PLL thus inviting degradation in the noise characteristic.

In the related art, a technique is described in U.S. Pat. No. 6,008,703, which sets a narrower PLL bandwidth than a modulation bandwidth and previously amplifying (pre-distorting), with modulation data, the modulating signal component suppressed by the frequency characteristic of a PLL.

FIG. 14 is a substantially faithful reproduction of the configuration shown in FIG. 2A of U.S. Pat. No. 6,008,703. In FIG. 14, a phase comparator 36, a loop filter 40, a voltage-controlled oscillator (VCO) 26, and a multilevel frequency divider 30 constitute a PLL.

Digital modulation data contains a frequency component exceeding the cutoff frequency of a PLL. A digital compensation filter 46 is used to provide digital modulation data with a characteristic inverse to the frequency characteristic of a PLL and an adder 50 is used to overlay a carrier signal. Next, the output signal of the adder 50 is modulated by the Σ Δ modulator 56 and the resulting modulating signal is used to modulate the multilevel frequency divider 30. A modulated carrier signal is thus output from the VCO 26.

(Referenced Patent Document) U.S. Pat. No. 6,008,703 (FIGS. 2A, 3A–3C, and 4)

When the above-mentioned technique is used, a flat gain characteristic can be theoretically obtained in a frequency band exceeding a cutoff frequency of a PLL concerning a closed loop frequency characteristic of a PLL. This should substantially broaden the PLL.

In case a PLL that is an analog circuit is formed into an integrated circuit, resistor and capacitor values may vary depending on the manufacture of circuit components, and the frequency characteristic of a PLL may vary accordingly. Thus, the frequency characteristic of a PLL is changed. On the other hand, the characteristic of a digital compensation filter is not changed because it is fixed by filter coefficient determined at design. As a result, the frequency characteristic of a PLL and the frequency characteristic of a digital compensation filter do not match each other.

In reality, it is difficult to obtain a flat gain characteristic in a frequency range exceeding the cutoff frequency of a PLL.

Examination results conducted by the inventor of this application are described in more details with reference to FIGS. 15 and 16.

FIG. 15 is a characteristic curve showing an ideal frequency characteristic in a related art circuit. The gain in the vertical axis in FIG. 15 is obtained by normalizing the gain in the frequency band of the PLL 6 to 0[db]. The closed loop frequency characteristic of the PLL is represented by the low-pass frequency characteristic of a cutoff frequency, similar to a characteristic curve A in FIG. 15. The characteristic of the digital compensation filter 46 in FIG. 14 has a frequency characteristic represented by the inverse characteristic of the frequency characteristic of a PLL, similar to a characteristic curve B in FIG. 15.

The digital modulation data shown in FIG. 14 is a signal of a digital value in the frequency band fBW. The digital modulation data undergoes amplification of a signal component in an area exceeding the frequency band of the PLL 6 by way of the digital compensation filter 46 as a digital filter, and the amplified signal is used to modulate the multilevel frequency divider.

As a result, the frequency characteristic of a modulated carrier signal output from the VCO 26 in FIG. 14 is synthesized with the frequency characteristic of a PLL to form a flat frequency characteristic, as shown by a characteristic curve C shown in FIG. 15. Thus, it is possible to perform modulation even in case the modulation bandwidth exceeds the bandwidth of a PLL (cutoff frequency), thereby providing both modulation accuracy and good noise characteristic.

As mentioned earlier, in reality, it is difficult to obtain such a gain characteristic due to a reason such as a variation in the characteristic of circuit components of a PLL. For example, in case a PLL is formed into an integrated circuit, resistor and capacitor values vary depending on the manufacture of circuit components, and the frequency characteristic of a PLL varies accordingly.

FIG. 16 is a characteristic curve showing the frequency characteristic obtained in case the frequency characteristic of a PLL in a related art circuit shown in FIG. 14 has varied.

In FIG. 16, a characteristic curve Ax shows a closed loop frequency characteristic of a PLL where the cutoff frequency has changed to fcx. It is assumed that the frequency characteristic of a digital compensation filter is unchanged from the design stage because it is a digital filter (characteristic curve B). Thus, the synthesized frequency characteristic is no longer flat, such as a characteristic curve Cx shown in FIG. 16.

In this way, a deviation is generated between the frequency characteristic of a PLL and the frequency characteristic of a digital compensation filter due to a variation in the manufacture of an integrated circuit. This prevents a flat characteristic from being obtained, which degrades the modulation accuracy.

The invention has been accomplished based on such examination results and has as an object to provide a modulator capable of performing wideband modulation using a PLL frequency synthesizer which can prevent degradation in modulation accuracy even in the presence of a variation in the manufacture of circuit components, and a correction method therefor.

DISCLOSURE OF THE INVENTION

A modulator according to the invention comprises a PLL including a voltage-controlled oscillator, a frequency divider and a phase comparator, the modulator generating a modulating signal based on the modulation data having information on a wider bandwidth than the frequency bandwidth of the PLL, setting the division ratio of the frequency divider by way of this modulating signal, and outputting a modulated carrier signal from the voltage-controlled oscillator as well as performing filtering processing by way of a pre-distortion filter on the modulation data to provide a frequency characteristic inverse to the frequency characteristic of the PLL in a process of generating the modulation signal, thereby allowing wideband modulation, wherein the modulator comprises error detection means for detecting a difference between an amplitude value in a frequency equal to or below the cutoff frequency of the PLL and an amplitude value in a frequency higher than the cutoff frequency concerning an a.c. component of the modulating signal appearing on a control terminal of the voltage-controlled oscillator, and frequency characteristic correction means for correcting at least one of the frequency characteristic of the PLL and the frequency characteristic of the pre-distortion filter in a direction the detected difference is eliminated.

With this configuration, it is possible to correct the frequency characteristic of a PLL or a pre-distortion filter. This correction eliminates the deviation between the frequency characteristic of the PLL and that of the pre-distortion filter thus providing a flat gain characteristic even in a frequency band exceeding the cutoff frequency of the PLL. As a result, it is possible to prevent degradation in modulation accuracy even in the presence of a variation in the manufacture of circuit components.

The modulator according to the invention comprises a selector for selectively inputting, as the modulation data, first calibration data on a frequency equal to or below the cutoff frequency of the PLL and second calibration data on a frequency above the cutoff frequency of the PLL.

With this configuration, it is possible to predict the deviation between the frequency characteristic of the PLL and that of the pre-distortion filter thus assuring precise frequency correction.

A modulator according to the invention comprises: a PLL including a voltage-controlled oscillator for outputting a modulated carrier signal, a frequency divider for dividing the frequency of an output signal of the voltage-controlled oscillator by a modulated division ratio, a phase comparator for comparing the phase of the output signal of the frequency divider and the phase of a reference signal and outputting the phase difference, a charge pump for converting the output signal of the phase comparator to a voltage or a current, and a loop filter for performing low-pass filtering of the output signal of the charge pump and outputting the resulting signal to the voltage-controlled oscillator; a modulation data generator for generating and outputting modulation data having the information on a wider bandwidth than the bandwidth of the PLL; a pre-distortion filter which has a characteristic inverse to the frequency characteristic of the PLL approximated and which filters the modulation data; division ratio modulation means for modulating the output signal of the pre-distortion filter and outputting the resulting output signal as a modulating signal used to set the division ratio of the frequency divider; and a pre-distortion filter frequency characteristic correction means for outputting a control signal for varying the frequency characteristic of the pre-distortion filter.

With this configuration, it is possible to vary the cutoff frequency of a pre-distortion filter even in the presence of a variation in the frequency band of a PLL in order to correct the variation thus preventing degradation in modulation accuracy.

The modulator according to the invention comprises a calibration data generator for generating and outputting, to the pre-distortion filter, first calibration data having the frequency information on the frequency band of the PLL and second calibration data having the frequency information on the band outside the frequency band of the PLL, wherein the pre-distortion filter frequency characteristic correction means comprises: an A/D converter for converting to a digital signal the amplitude value of an ac component having the division ratio modulated by the division ratio modulation means appearing on the output of the loop filter in response to the first and second calibration data respectively; comparison means for comparing for comparing the data of the two amplitude values output from the A/D converter and outputting the difference information; and filter characteristic control means for varying the characteristic of the pre-distortion filter in accordance with the difference information output from the comparison means.

With this configuration, it is possible to readily detect a deviation between the frequency characteristic of a PLL and that of a pre-distortion filter by comparing the amplitudes of ac components corresponding to the first and second calibration data appearing on the output of a loop filter.

Or, the modulator according to the invention comprises a calibration data generator for generating and outputting, to the pre-distortion filter, first calibration data having the frequency information on the frequency band of the PLL and second calibration data having the frequency information on the band outside the frequency band of the PLL and a demodulator for demodulating the output signal of the voltage-controlled oscillator, wherein the pre-distortion filter frequency characteristic correction means comprises: an A/D converter for converting to a digital signal the amplitude value of an ac component having the division ratio modulated by the division ratio modulation means appearing on the output of the loop filter in response to the first and second calibration data respectively; comparison means for comparing for comparing the data of the two amplitude values output from the A/D converter and outputting the difference information; and filter characteristic control means for varying the characteristic of the pre-distortion filter in accordance with the difference information output from the comparison means.

With this configuration, it is possible to readily detect a deviation between the frequency characteristic of a PLL and that of a pre-distortion filter, by comparing the amplitude values of the output signals of a demodulator based on the idea that ac components corresponding to the first and second calibration data appearing on the output of the loop filter can be obtained also by demodulating the output signal (modulated carrier) of the voltage-controlled oscillator.

A modulator according to the invention comprises: a PLL including a voltage-controlled oscillator for outputting a modulated carrier signal, a frequency divider for dividing the frequency of an output signal of the voltage-controlled oscillator by a modulated division ration, a phase comparator for comparing the phase of the output signal of the frequency divider and the phase of a reference signal and outputting the phase difference, a charge pump for converting the output signal of the phase comparator to a voltage or a current, and a loop filter for performing low-pass filtering of the output signal of the charge pump and outputting the resulting signal to the voltage-controlled oscillator; a modulation data generator for generating and outputting modulation data having the information on a wider bandwidth than the bandwidth of the PLL; a pre-distortion filter which has a characteristic inverse to the frequency characteristic of the PLL approximated and which filters the modulation data; division ratio modulation means for modulating the output signal of the pre-distortion filter and outputting the resulting output signal as a modulating signal used to set the division ratio of the frequency divider; and a PLL frequency characteristic correction means for outputting a control signal for varying the current gain of the charge pump.

With this configuration, it is possible to vary the frequency characteristic of a PLL by controlling the current of the charge pump and correct a variation in the frequency characteristic of a PLL and that of a pre-distortion filter, thereby preventing degradation in modulation accuracy.

The modulator according to the invention comprises a calibration data generator for generating and outputting, to the pre-distortion filter, first calibration data having the frequency information on the frequency band of the PLL and second calibration data having the frequency information on the band outside the frequency band of the PLL, wherein the PLL frequency characteristic correction means comprises: an A/D converter for converting to a digital signal the amplitude value of an ac component having the division ratio modulated by the division ratio modulation means appearing on the output of the loop filter in response to the first and second calibration data respectively; comparison means for comparing the data of the two amplitude values output from the A/D converter and outputting the difference information; and charge pump current control means for varying the current gain of the charge pump in accordance with the difference information output from the comparison means.

With this configuration, it is possible to readily detect a deviation between the frequency characteristic of a PLL and that of a pre-distortion filter based on the output of a loop filter.

Or, the modulator according to the invention comprises a calibration data generator for generating and outputting, to the pre-distortion filter, first calibration data having the frequency information on the frequency band of the PLL and second calibration data having the frequency information on the band outside the frequency band of the PLL and a demodulator for demodulating the output signal of the voltage-controlled oscillator, wherein the PLL frequency characteristic correction means comprises: an A/D converter for converting to a digital signal the amplitude value of an ac component having the division ratio modulated by the division ratio modulation means appearing on the output of the loop filter in response to the first and second calibration data respectively; comparison means for comparing the data of the two amplitude values output from the A/D converter and outputting the difference information; and charge pump current control means for varying the current gain of the charge pump in accordance with the difference information output from the comparison means.

With this configuration, it is possible to readily detect a deviation between the frequency characteristic of a PLL and that of a pre-distortion filter based on the output of the demodulator (calibration signal component).

In another aspect, the filter characteristic control means comprises a memory for storing control data used to change the frequency characteristic of the pre-distortion filter.

With this configuration, it is possible to readily generate a control signal for the frequency characteristic of a pre-distortion filter by using a control data lookup table stored in a memory such as a ROM. This downsizes the circuit scale and reducing the overall cost.

In another aspect, the charge pump current control means comprises a memory for storing control data used to change the frequency characteristic of the PLL.

With this configuration, it is possible to readily generate a control signal for the current gain of a charge pump by using a control data lookup table stored in a memory such as a ROM. This downsizes the circuit scale and reducing the overall cost.

In another aspect, a low-pass filter is provided having a higher cutoff frequency than the bandwidth of the modulating signal between the output end of the loop filter and the input end of the voltage-controlled oscillator.

With this configuration, it is possible to reduce a noise in a higher frequency band than the modulation band (a higher frequency band than the maximum frequency indicated by the modulation data) thereby improving the noise characteristic.

In the above configuration, the first and second calibration data have a single frequency information item.

With this configuration, a calibration signal (modulating signal for calibration) has a single tone, which simplifies the comparison processing in calibration. In other words, the correction error is reduced so that the modulation accuracy is improved.

In another aspect, in the pre-distortion filter frequency characteristic correction means, the comparison means compares the amplitude values of an ac component having the division ratio modulated by the division ratio modulation means appearing on the output of the loop filter in response to the first and second calibration data respectively, immediately after varying the output frequency of the voltage-controlled oscillator, and the filter characteristic control means varies the characteristic of the pre-distortion filter in accordance with the comparison result.

With this configuration, it is possible to simultaneously vary the frequency characteristic of a PLL and that of a pre-distortion filter. This improves the calibration accuracy thereby improving the modulation accuracy.

In another aspect, the loop filter and the A/D converter are ac-coupled with each other.

With this configuration, a need is eliminated to allocate the number of bits of an AID converter to the dc component of a loop filter output, which improves the amplitude measurement accuracy of a calibration signal. Alternatively, it is possible to reduce the number of bits of an A/D converter which reduces the overall cost.

In another aspect, the modulator halts the operation of the A/D converter after varying the characteristic of the pre-distortion filter. With this configuration, it is possible to reduce the current consumption.

In another aspect, the modulator halts the operation of the demodulator after varying the characteristic of the pre-distortion filter. With this configuration, it is possible to reduce the current consumption.

In another aspect, the pre-distortion filter is an IIR-type digital filter.

With this configuration, it is possible to provide a frequency characteristic having the amplitude and phase of a PLL by way of a digital filter, which improves the modulation accuracy.

A mobile radio unit according to the invention comprises a modulator of any of the foregoing configuration. It is thus possible to improve the modulation accuracy of a transmit signal of a mobile radio unit.

A radio base station according to the invention comprises a modulator of any of the foregoing configuration. It is thus possible to improve the modulation accuracy of a transmit signal of a mobile radio unit.

A correction method for a modulator according to the invention is a method for correcting a modulator which generates a modulating signal based on the modulation data having information on a wider bandwidth than the frequency bandwidth of the PLL, sets the division ratio of the frequency divider by way of this modulating signal, and outputs a modulated carrier signal from the voltage-controlled oscillator as well as performs filtering processing by way of a pre-distortion filter on the modulation data to provide a frequency characteristic inverse to the frequency characteristic of the PLL in a process of generating the modulation signal, thereby allowing wideband modulation, wherein the method comprises an error detecting step of detecting a difference between an amplitude value in a frequency equal to or below the cutoff frequency of the PLL and an amplitude value in a frequency higher than the cutoff frequency concerning an ac component of the modulating signal appearing on a control terminal of the voltage-controlled oscillator, and a frequency characteristic correcting step of correcting at least one of the frequency characteristic of the PLL and the frequency characteristic of the pre-distortion filter in a direction the detected difference is eliminated.

With this procedure, it is possible to match the frequency characteristic of a PLL and the frequency characteristic of a pre-distortion filter. This provides a flat frequency characteristic even in a frequency range exceeding the cutoff frequency of a PLL, which prevents degradation in modulation accuracy.

Figure 1:
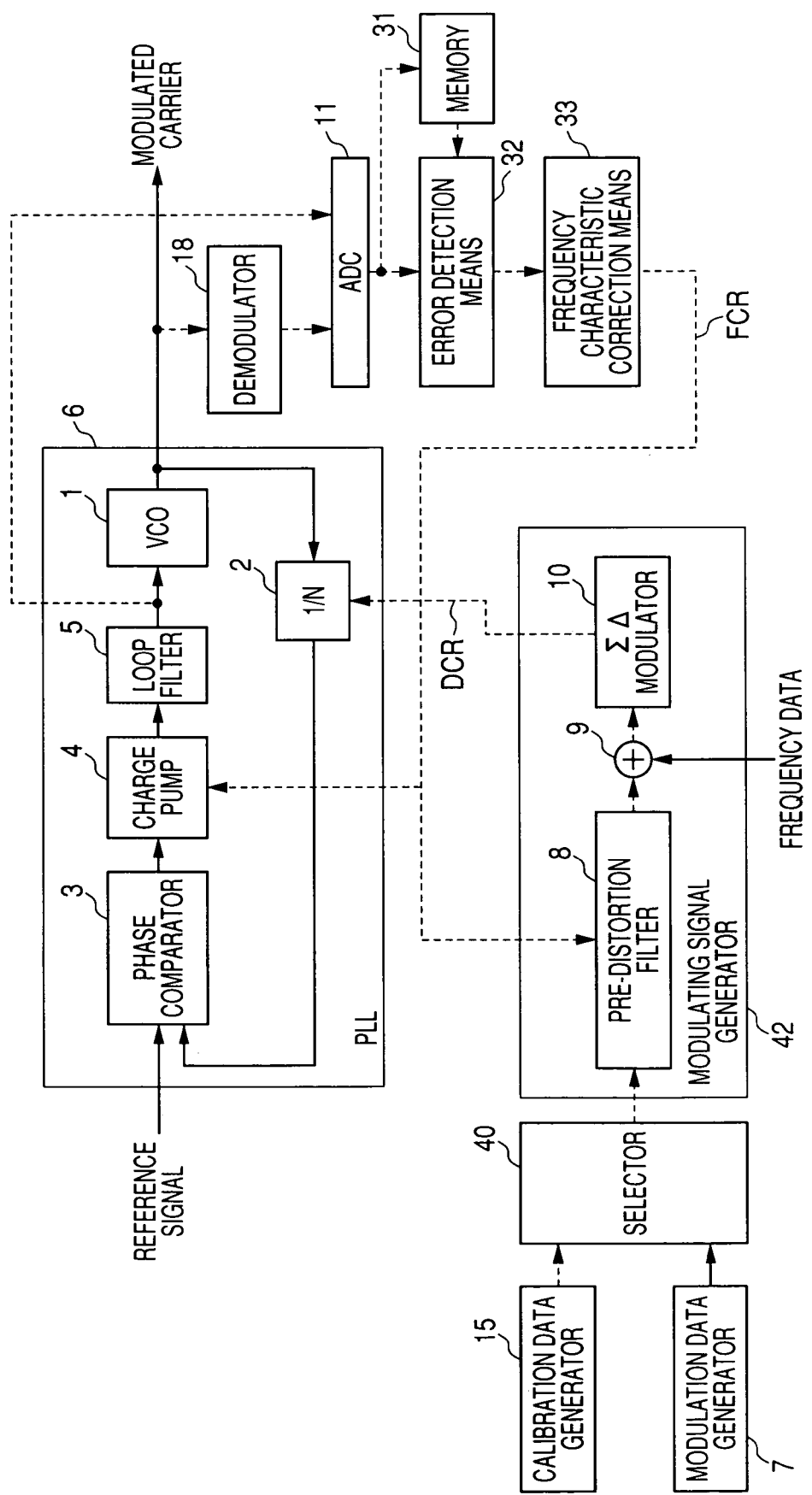
FIG. 1 is a block diagram showing the configuration of a wideband modulator using a PLL frequency synthesizer according to a first embodiment of the invention.

In the drawings, a numeral 1 represents a voltage-controlled oscillator (VCO), 2 a frequency divider, 3 a phase comparator, 4 a charge pump, 5 a loop filter, 6 a PLL (Phase-locked Loop), 7 a modulation data generator, 8 a pre-distortion filter, 9 an adder, 10 a $\Sigma \Delta$ modulator, 11 an A/D converter (ADC), 12 a register, 13 comparison means, 14 filter characteristic control means, 15 a calibration data generator, 16 a selector, 17, 27 correction means, 18 a demodulator, 19 a low-pass filter, 20 a charge pump current control means, 31 a memory, 32 error detection means, 33 a frequency characteristic correction means, 40 a selector, and 42 a modulating signal generator.

BEST MODE FOR CARRYING OUT THE INVENTION

Embodiments of the invention are described below referring to the drawings. In this embodiment, it is shown a constitutional example of a modulator capable of performing wideband modulation using a PLL frequency synthesizer, which is used, for example, as a mobile radio terminal or a radio base apparatus of a mobile communication system.

(First Embodiment)

Figure 2:
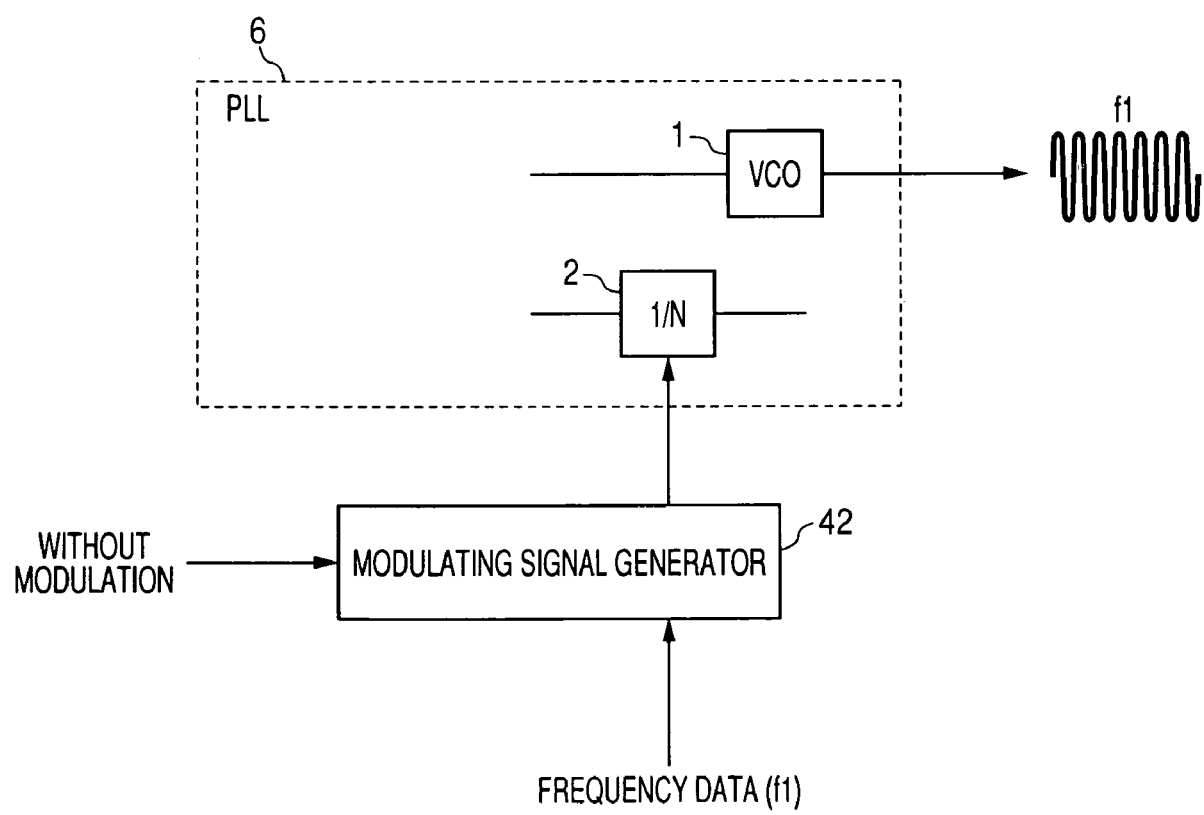
FIG. 2 is an explanatory operation drawing which illustrates the specific operation of calibration in the modulator according to the first embodiment.
Figure 3:
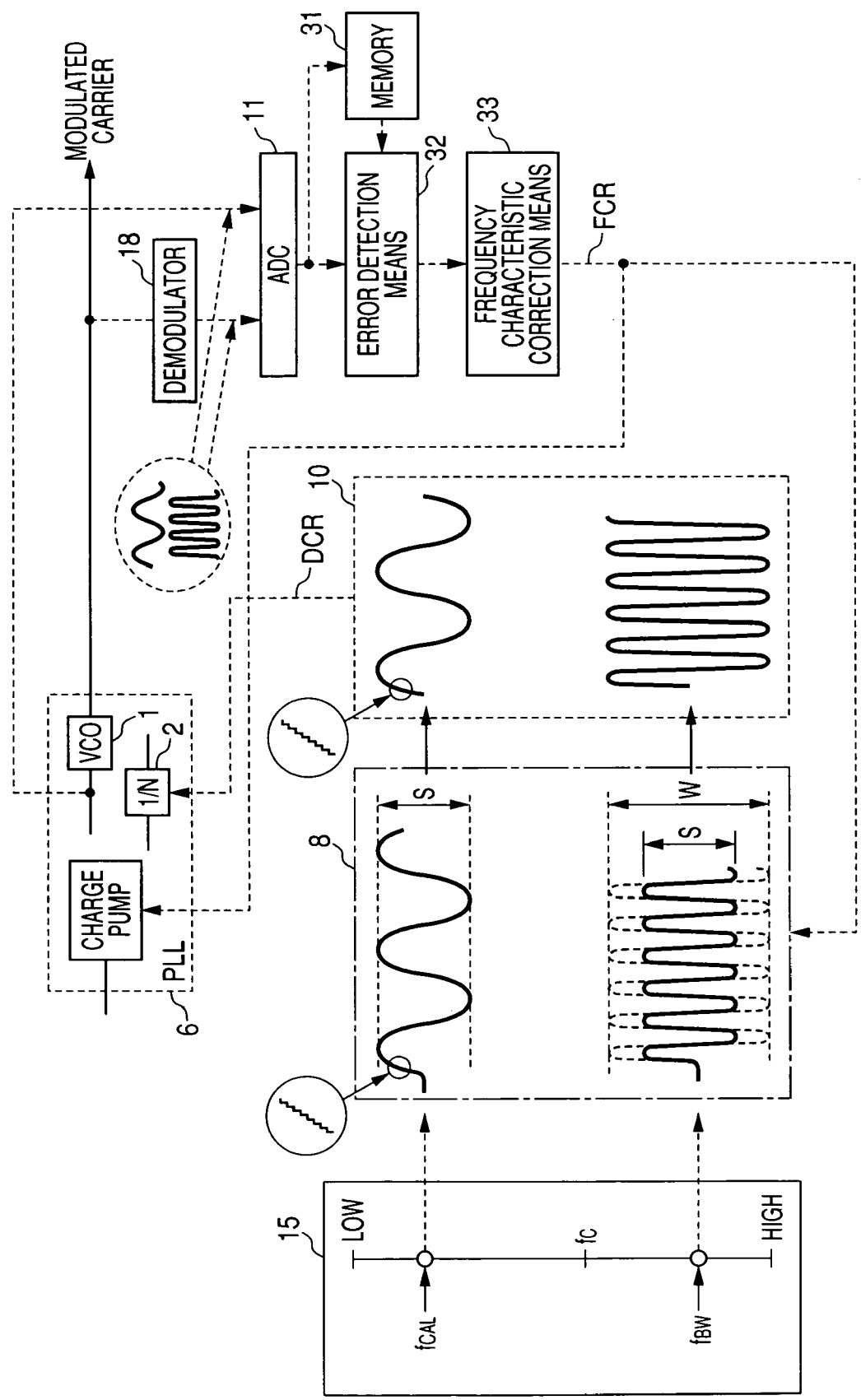
FIG. 3 is an explanatory operation drawing which illustrates the specific operation of calibration in the modulator according to the first embodiment.

FIG. 1 is a block diagram showing the configuration of a wideband modulator using a PLL frequency synthesizer according to a first embodiment of the invention. FIGS. 2 and 3 illustrate the operation of calibration in the modulator shown in FIG. 1.

In the first embodiment, a basic configuration of the invention and its feature are clarified. The modulator according to this embodiment shown in FIG. 1 modulates the division ratio of a frequency divider in a PLL and the modulating signal appears on the control terminal of a VCO, as a result of which a modulated carrier signal is output from the VCO.

As shown in FIG. 1, a PLL 6 comprises a voltage-controlled oscillator (hereinafter referred to as the VCO) 1, a frequency divider (variable frequency divider having a division ratio of 1/N, where N is an arbitrary integer for convenience in the example of FIG. 1) 2, a phase comparator 3 for comparing the phase of an output signal of the frequency divider 2 and the phase of a reference signal to output a phase difference, a charge pump 4 for converting the output signal of the phase comparator 3 to a voltage or a current, and a loop filter 5 for averaging the output signal of the charge pump 4.

The division ratio of the frequency divider 2 is modulated by a modulating signal DCR. Or, the modulating signal DCR itself indicates a division ratio. The modulating signal DCR is generated by a modulating signal generator 42. It is possible to selectively input modulation data from a modulation data generator or calibration data from the calibration data generator 15 to the modulating signal generator 42.

The modulating signal generator 42 comprises a pre-distortion filter 8 which has an inverse characteristic to the frequency characteristic of the PLL 6 and which filters modulation data (or calibration data), an adder 9 for adding the frequency data specifying the output signal frequency of the PLL 6 and the output signal of the pre-distortion filter 8 and a Σ Δ modulator 10 for converting the output signal of the adder 9 to an output signal having the division ratio set to the frequency divider 2 and outputting the resulting signal (or generating a modulation signal DCR).

In this type of modulator using a PLL, the average value of the modulating signal DCR must contain a fractional value in order to provide modulation accuracy. This is made possible through a generally known fractional-N synthesis technique. In order to perform noise shaving of a quantization noise which accompanies the fractional-N synthesis process, the Σ Δ A modulator 10 is provided.

In the modulator according to this embodiment shown in FIG. 1, the modulating signal DCR is used to modulate the division ratio of the frequency divider 2. Thus, the modulating signal is overlaid on the frequency control terminal of the VCO 1 via the frequency divider 2, the phase comparator 3, the charge pump 4 and the loop filter 5, and the VCO 1 outputs a modulated carrier signal. That is, the voltage amplitude of the modulating signal appearing on the frequency control terminal of the VCO 1 represents the maximum frequency deviation of the modulated carrier signal as an output of the VCO 1.

Further, the modulator according to this embodiment comprises an A/D converter (ADC) 11, error detection means 32, a memory 31, and a frequency characteristic correction means 33 in order to correct a deviation between the frequency characteristic of a PLL and the frequency characteristic of the pre-distortion filter 8. The modulator comprises a demodulator 18 as required.

In FIG. 1, a broken-line arrow indicates the path of a signal related to correction of the frequency characteristic.

Calibration data may be, for example, first calibration data of a lower frequency (fCAL: single frequency) than the cutoff frequency of the PLL 6 and second calibration data of a higher frequency (fBW: single frequency) than the cutoff frequency of the PLL 6.

When the first calibration data is input to a modulating signal generator 42 via the selector 40, the ac (alternating current) component of the frequency fCAL (below the cutoff frequency of the PLL 6) indicated by the first calibration data appears on the output of the loop filter 5. The amplitude value of the ac component is converted to a digital value by the A/D converter 11 and temporarily stored in the memory 31.

Next, when the second calibration data is input to a modulating signal generator 42 via the selector 40, the ac component of the frequency fBW (above the cutoff frequency of the PLL 6) indicated by the second calibration data appears on the output of the loop filter 5. The amplitude value of the ac component of the output signal of the loop filter is converted to a digital value by the AID converter 11 and transmitted to the error detection means 32.

The error detection means 32 fetches the amplitude data of the ac component of the frequency fCAL stored in the memory 31 and compares the fetched data with the amplitude data of the ac component of the frequency F2 transmitted.

The calibration data has already undergone processing to increase the gain in the modulation band exceeding the cutoff frequency of the PLL 6. Ideally, the linearity of gain should be assured around the cutoff frequency of the PLL 6.

Theoretically, the amplitude value of the ac component of the frequency f2 appearing on the output of the loop filter 5 should match the amplitude value of the ac component of the frequency fCAL mentioned above. However, in reality, the frequency characteristic of the PLL 6 varies due to a variation in the manufacture of circuit components, which causes an error.

As mentioned above, the voltage amplitude of a modulating signal appearing on the frequency control terminal of the VCO 1 represents a maximum frequency deviation of the modulated carrier signal as an output of the VCO 1. Thus, a difference in the voltage amplitude value between the ac component of the frequency fCAL and the frequency fBW appearing on the frequency control terminal of the VCO 1 represents a modulation error, which directly leads to a drop in the modulation accuracy.

The error detection means 32 detects the difference (error) in the voltage amplitude value of the ac component corresponding to the frequencies fCAL, fBW It is thus possible to detect a difference in the gain characteristic of the frequency spectrum below and above the cutoff frequency of the PLL 6.

The result of error detection by the error detection means 32 is provided to the frequency characteristic correction means 33. The frequency characteristic correction means 33 generates a control signal FCR for correction a gain difference. The control signal FCR is supplied to the pre-distortion filter 8 or the charge pump as a component of the PLL 6.

As a result, the frequency characteristic (cutoff frequency) of the pre-distortion filter 8 or the volume of the current in the charge pump 4 varies, which varies the cutoff frequency of the PLL 6.

In this way, a flat gain characteristic is provided even in a frequency band (modulation band) exceeding the cutoff frequency of a PLL.

The ac component of the modulating signal DCR appearing on the output of the loop filter 5 can be reproduced by demodulating the output signal (frequency-modulated signal) of the VCO 1. Thus, similar frequency characteristic correction is made by demodulating the output signal of the VCO 1 and inputting the demodulated signal to the A/D converter 11 instead of directly inputting the output signal of the loop filter 5 to the A/D converter 11.

Specific operation of the first embodiment is described below referring to FIGS. 2 and 3.

Prior to calibration, frequency data (f1) is supplied to the modulating signal generator 42 as shown in FIG. 2 (f1 is not modulated) and a carrier signal of a frequency f1 is output from the VCO 1 while the PLL is being locked.

Then calibration is performed as shown in FIG. 3.

From the calibration data generator 15, first calibration data (having the information of fCAL as a frequency below the cutoff frequency fc of the PLL 6) is generated and the data is input to the pre-distortion filter 8. The frequency input is below the cutoff frequency fc of the PLL 6 so that it is not amplified. A first calibration signal (having a signal amplitude of "S") is output.

The division ratio of the frequency divider 2 is modulated by the first calibration signal. As mentioned above, the ac component of the modulating signal DCR appears on the frequency control terminal of the VCO 1. The ac component has a signal amplitude of "S".

Similarly, second calibration data (having the information of fBW above the cutoff frequency fc of the PLL 6) is generated and the data is input to the pre-distortion filter 8. The pre-distortion filter 8 expands (amplifies) the signal amplitude from "S" to "W" so as to compensate for a drop in the signal amplitude in the PLL 6.

The second calibration signal passes through the ΣΔ modulator 10 and is formed into a finer-gradation signal (the modulating signal DCR), which is used to modulate the division ratio of the frequency divider 2.

The ac component of the modulating signal DCR appears on the frequency control terminal of the VCO 1. The ideal signal amplitude of the ac component is "S" although the actual amplitude is not "S" due to a variation in the frequency characteristic of the PLL.

The error detection means 32 detects a difference between amplitude values and varies the frequency characteristic (to be more specific, cutoff frequency) of the PLL 6 or the pre-distortion filter 8 in a direction the difference is eliminated.

In this embodiment, by way of the above operation, a flat gain characteristic is provided even in a frequency range exceeding the cutoff frequency of a PLL, thereby performing high-accuracy wideband modulation.

(Second Embodiment)

Figure 4:
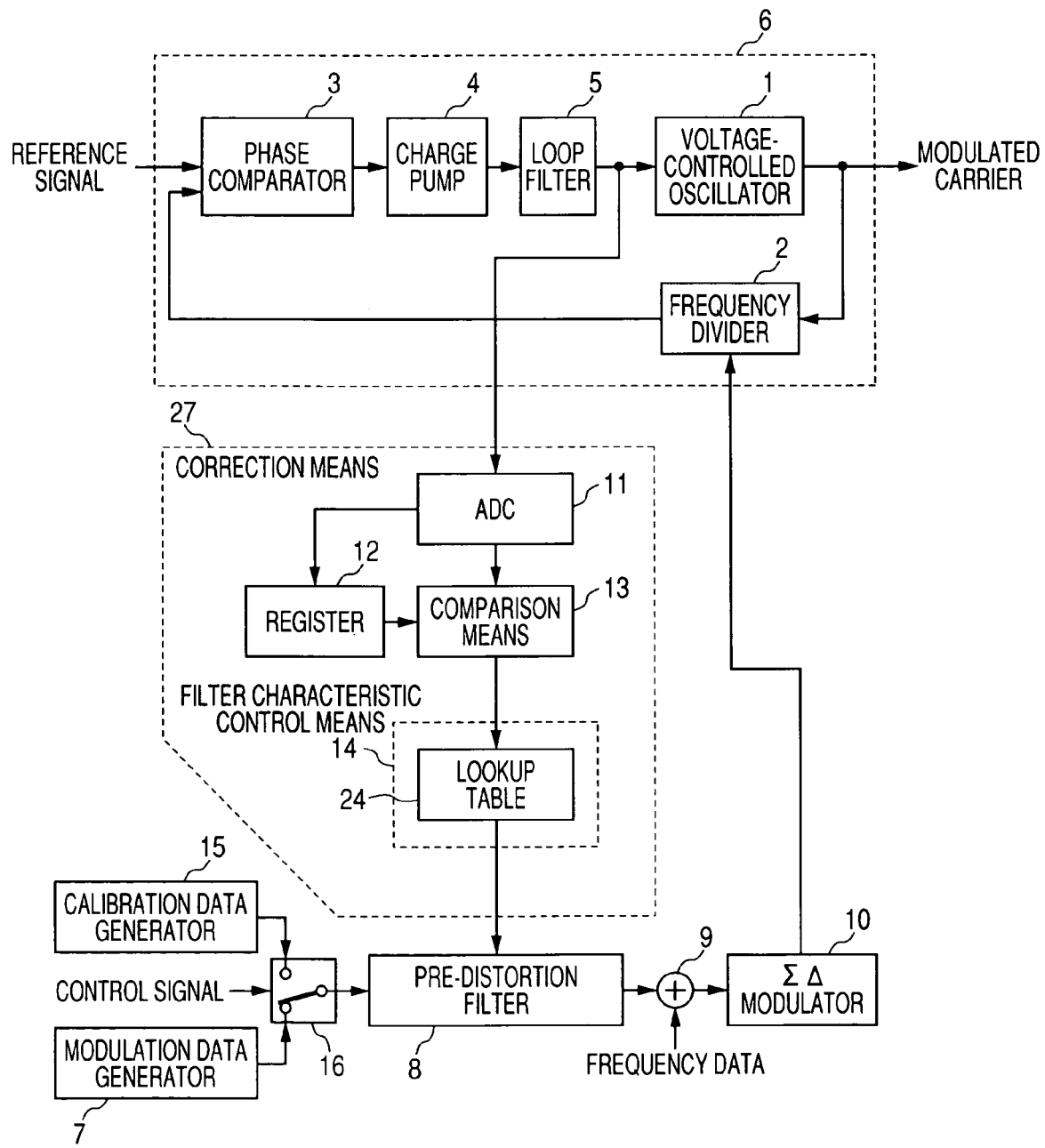
FIG. 4 is a block diagram showing the configuration of a wideband modulator using a PLL frequency synthesizer according to a second embodiment of the invention.

FIG. 4 is a block diagram showing the configuration of a wideband modulator using a PLL frequency synthesizer according to a second embodiment of the invention. In the configuration of FIG. 4, same components as those in the FIG. 1 are given same signs and numerals in general.

A modulator according to the second embodiment uses as an input the output signal of the loop filter 5 and comprises correction means 27 for outputting a control signal for correcting the frequency characteristic. The correction means 27 comprises, for example, an A/D converter (ADC) 11 for converting an analog signal to a digital value, a register 12 for storing the output signal of the A/D converter 11, comparison means 13 for comparing the data stored in the register 12 with the output signal of the A/D converter 11, and a filter characteristic control means 14 for controlling the characteristic of the pre-distortion filter 8 based on the output signal of the compassion means 13.

The second embodiment further comprises a calibration data generator 15, a modulation data generator 7, and a selector (selection switch) 16 for selecting between the output signals of the calibration data generator 15 and the modulation data generator 7 and outputting the selected signal to the pre-distortion filter 8.

While the configuration of the filter characteristic control means 14 is not particularly limited, the filter characteristic control means 14 comprises a ROM (lookup table) storing control data in this embodiment, as shown in FIG. 4.

Figure 16:
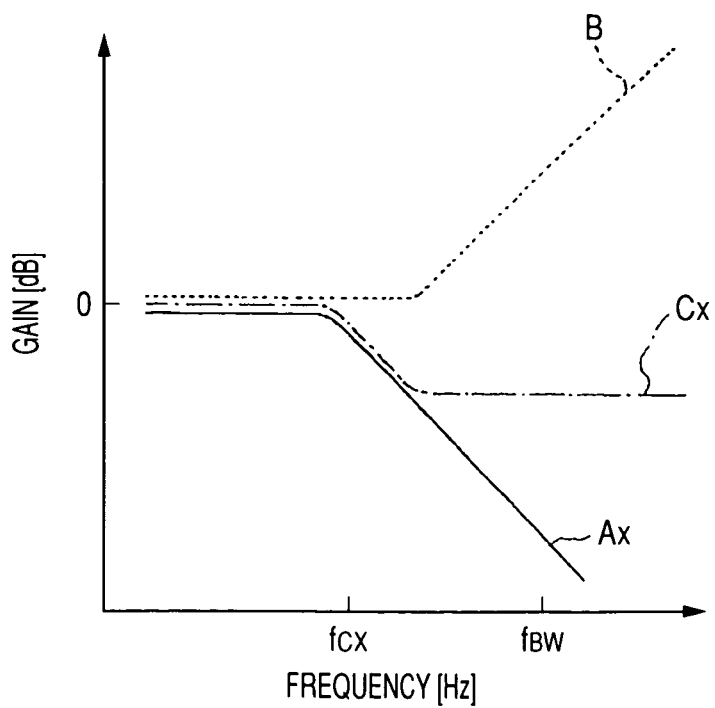
FIG. 16 is a frequency characteristic graph which illustrates the results of examination by the inventor where the cutoff frequency has changed.

Next, operation of the modulator according to the second embodiment is described below. It is assumed that a deviation is present between the frequency characteristic of the PLL 6 and that of the pre-distortion filter 8 on the modulator according to the second embodiment, as shown in FIG. 16.

When the frequency data is updated, the output frequency of the VCO 1 is changed to a target frequency, same as the well-known operation of a PLL. Phase lock takes place immediately after the change of frequency. Then calibration is performed in order to correct a deviation in the frequency characteristic shown by the frequency characteristic Cx in FIG. 16.

Figure 5:
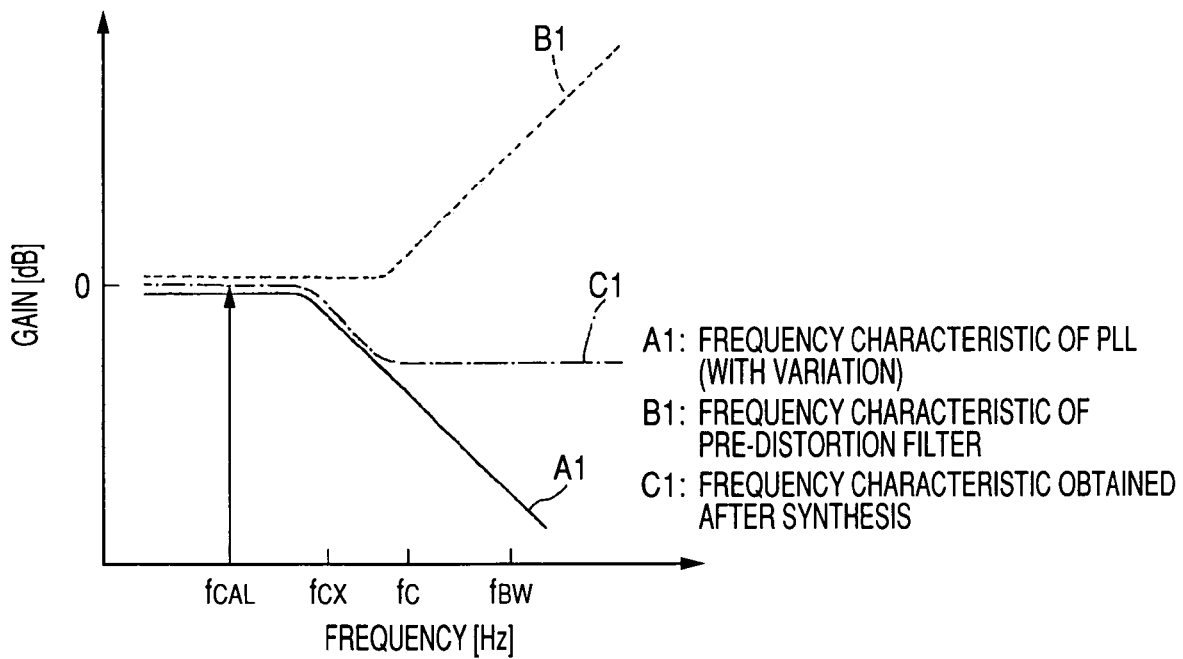
FIG. 5 is a frequency characteristic graph which illustrates the operation in the modulator according to the second embodiment.
Figure 6:
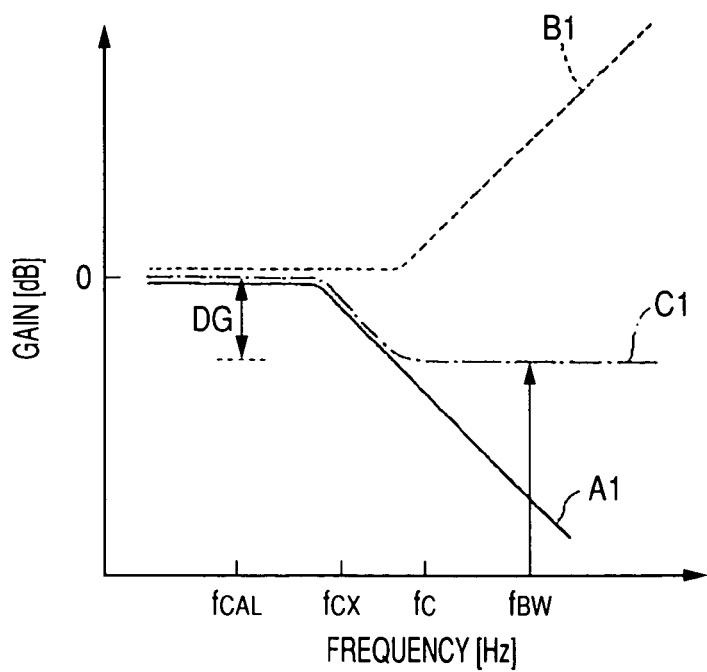
FIG. 6 is a frequency characteristic graph which illustrates the operation in the modulator according to the second embodiment.
Figure 7:
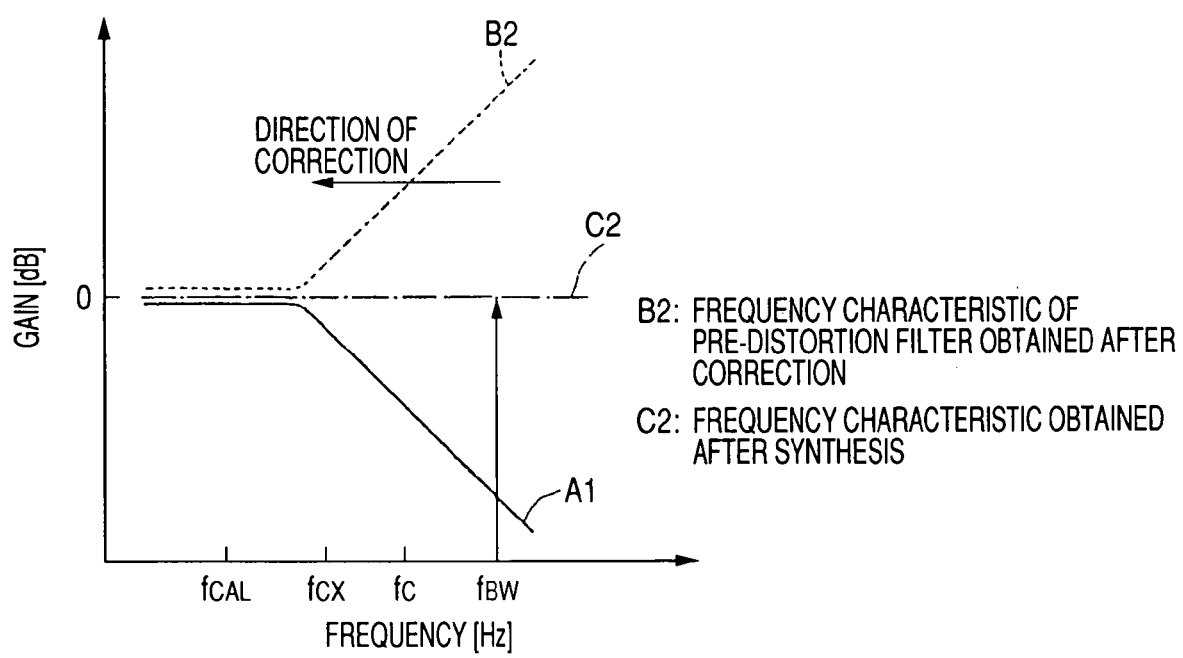
FIG. 7 is a frequency characteristic graph which illustrates the operation in the modulator according to the second embodiment.

FIGS. 5 through 7 are frequency characteristic graphs which illustrate the operation in the modulator according to the second embodiment.

After the phase lock, the calibration data generator 15 outputs a lower frequency (fCAL in this example) than the cutoff frequency as a frequency characteristic of the PLL as shown in FIG. 5. In this case, fCAL is set to a frequency below the variation range of the cutoff frequency which could take place due to a variation in the process of manufacturing of the loop filter 5.

The frequency component of fCAL, which is in the frequency band of the PLL 6, appears on the output of the loop filter 5. The amplitude of the ac component of the frequency fCAL is converted to a digital value by way of the A/D converter 11 and is stored into the register 12. In FIGS. 5 and 6, the frequency characteristic of the PLL 1, the frequency characteristic of the pre-distortion filter 8, and the synthesized frequency characteristic are A1, B1 and C1, respectively.

Next, the calibration data generator 15 outputs a frequency (fBW in this example) corresponding to the (upper limit of) the modulation bandwidth as shown in FIG. 6. The amplitude of the ac component of the frequency EBW is converted to a digital value by way of the A/D converter again and the obtained value is output to the comparison means 13. The comparison means 13 compares the value with the amplitude level of the frequency fCAL stored in the register 12 and outputs a comparison result.

Figure 15:
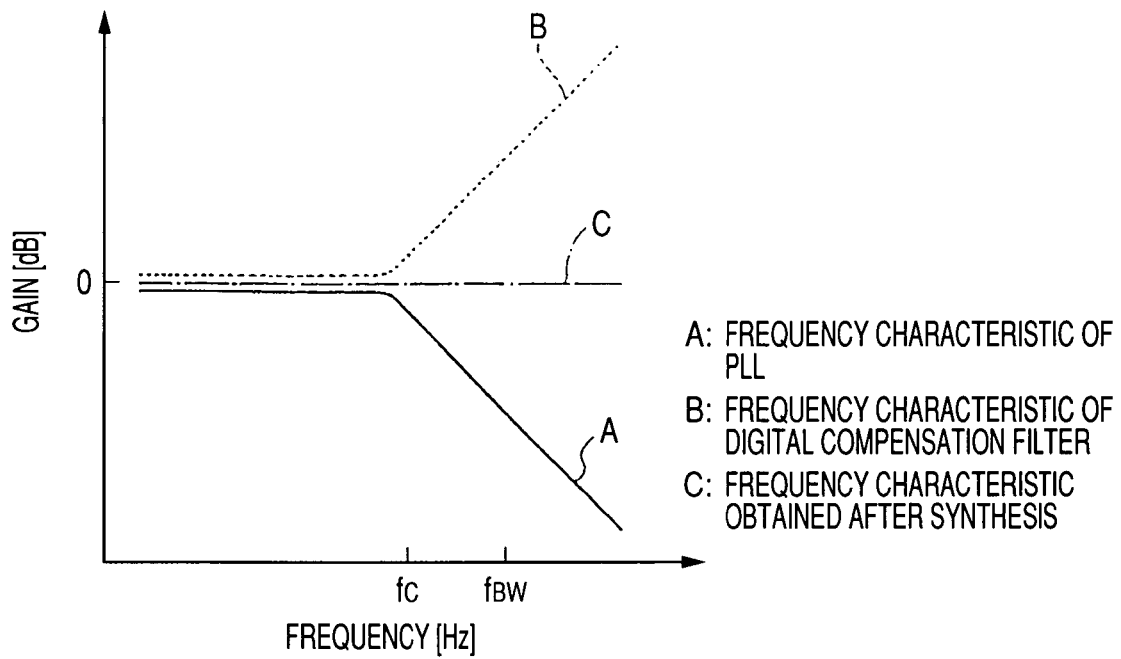
FIG. 15 is a frequency characteristic graph which illustrates the results of examination by the inventor.

As shown in FIG. 15, in case the frequency characteristic A of the PLL 6 and the frequency characteristic B of the pre-distortion filter 8 are not deviated from each other, the comparison error is 0 and the frequency characteristic C of the synthesized frequency is flat. In case there is a deviation as shown in FIG. 16, a comparison error occurs.

In case the frequency characteristic Al of the PLL is varied in a lower range as shown in FIG. 6 (the cutoff frequency is fc in FIG. 15 while it is fcx as a lower frequency in FIG. 6), the value of the ac component of the frequency fBW is smaller by DG than the value of the ac component of the frequency fCAL stored in the register 12.

Figure 8:
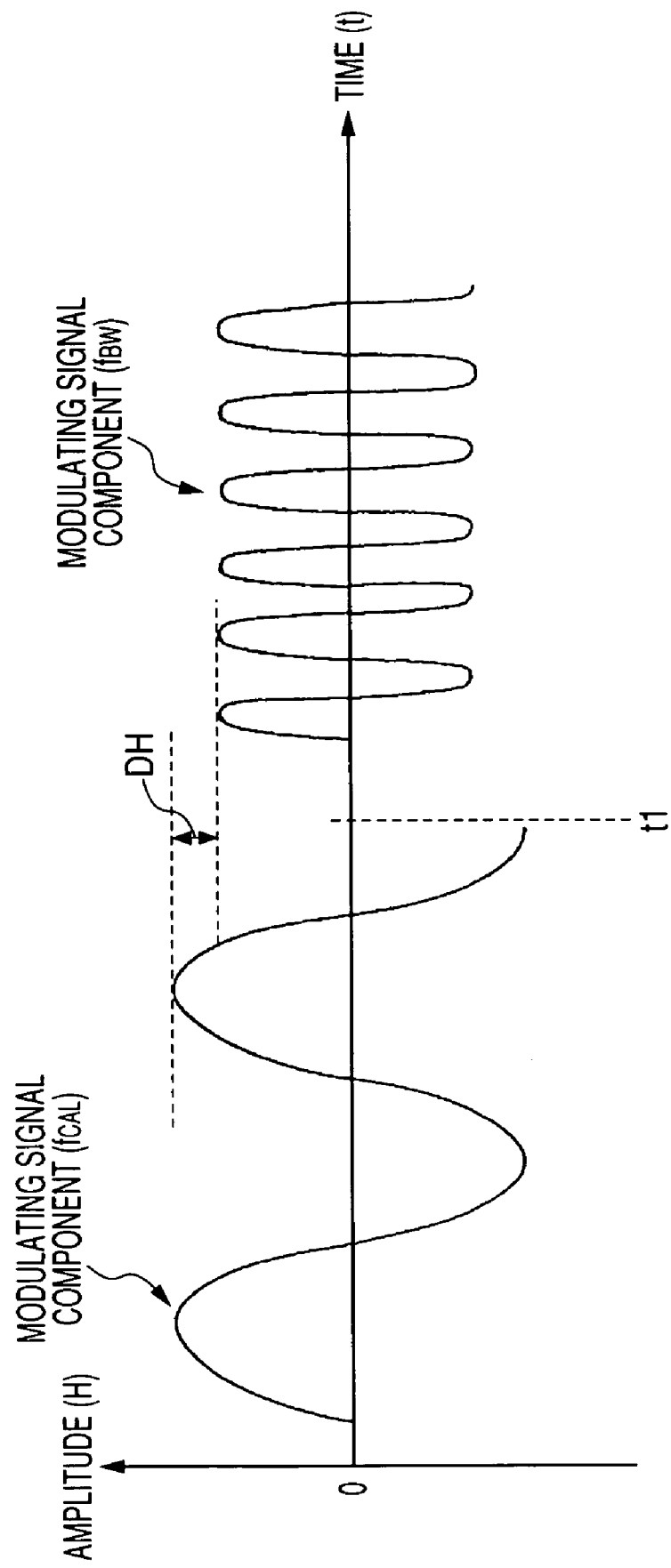
FIG. 8 is an explanatory operation drawing which illustrates a deviation between the amplitude value of a modulating signal component above the cutoff frequency of a PLL and the amplitude value of a modulating signal component equal to or below the cutoff frequency.

FIG. 8 shows a deviation between the amplitude value of a modulating signal component above the cutoff frequency of a PLL and the amplitude value of a modulating signal component equal to or below the cutoff frequency. It is assumed that the modulating signal component (ac component) of fCAL is output before the time t1 and the modulating signal component (ac component) of fBW is output after the time t1 in FIG. 8. In FIG. 8, amplitude values (peak values) have a difference of DH.

In case the frequency characteristic of the PLL is varied in a higher range, the value of the ac component of the frequency fBW is larger than the value of the ac component of the frequency fCAL stored in the register 12. The filter characteristic control means 14 varies the cutoff frequency of the pre-distortion filter 8 so that the comparison result output from the comparison means 13 will be 0.

As shown in FIG. 7, calibration is complete when the comparison result has reached 0. Next, modulation data is output from the modulation data generator 7 and supplied to the pre-distortion filter 8. By synthesizing the frequency characteristic A1 of the PLL 6 containing a deviation and the frequency characteristic B2 of the post-correction pre-distortion filter 8, the frequency characteristic C2 after synthesis is flattened.

In this way, according to the second embodiment, even in the presence of a variation in the frequency characteristic of a PLL, the cutoff frequency of the pre-distortion filter 8 is varied to correct the variation. This prevents degradation in the modulation accuracy.

The calibration signal is a single-tone (single-frequency) signal rather than a modulating signal. This assures high-accuracy comparison. The correction error is reduced so that the modulation accuracy is improved.

Calibration is made after phase lock. Even in case the control sensitivity (relationship of an oscillating frequency with respect to a voltage applied to a frequency control terminal; unit is Hz/V) of the VCO 1 varies for an oscillating frequency, calibration can eliminate the variation. This further improves the modulation accuracy.

While the output of the loop filter 5 is converted to a digital value by way of the A/D converter 11 and a signal is generated which controls the pre-distortion filter 8 by using the register 12, the comparison means 13, and the filter characteristic control means 14, another configuration may be employed as long as correction means having the same functionality is used.

The filter characteristic control means 14 comprises a ROM (lookup table) storing control data used to vary the cutoff frequency of the pre-distortion filter 8. This facilitates control of the pre-distortion filter 8 and reduces the circuit scale, thereby reducing the overall cost. The filter characteristic control means 14 may not comprise a ROM.

The calibration signal is a single-tone signal rather than a modulating signal so that the loop filter 5 may be ac-coupled with the A/D converter 11. For example, in case ac coupling is made using a high-pass filter where the signal of the frequency fCAL passes, there is no need to allocate the number of bits of the A/D converter 11 to the dc component of the output of the loop filter 5, which improves the amplitude measurement accuracy of the calibration signal. Reducing the number of bits of the AID converter 11 can reduce the overall cost.

After the characteristic of the pre-distortion filter is varied and calibration is over, operation of the A/D converter 11 may be halted until frequency data is updated next. This assures lower power consumption.

A pre-distortion filter is desirably an IIR filter. With an IIR filter, it is possible to provide a frequency characteristic having the amplitude and phase of a PLL by way of a digital filter, which improves the modulation accuracy.

Even in case a signal other than one having a single tone, such as a modulating signal is used as a calibration signal, correction means may be provided which is capable of varying the frequency characteristic of the pre-distortion filter 8 by using the output signal of the loop filter 5, in order to obtain the same effect.

(Third Embodiment)

Figure 9:
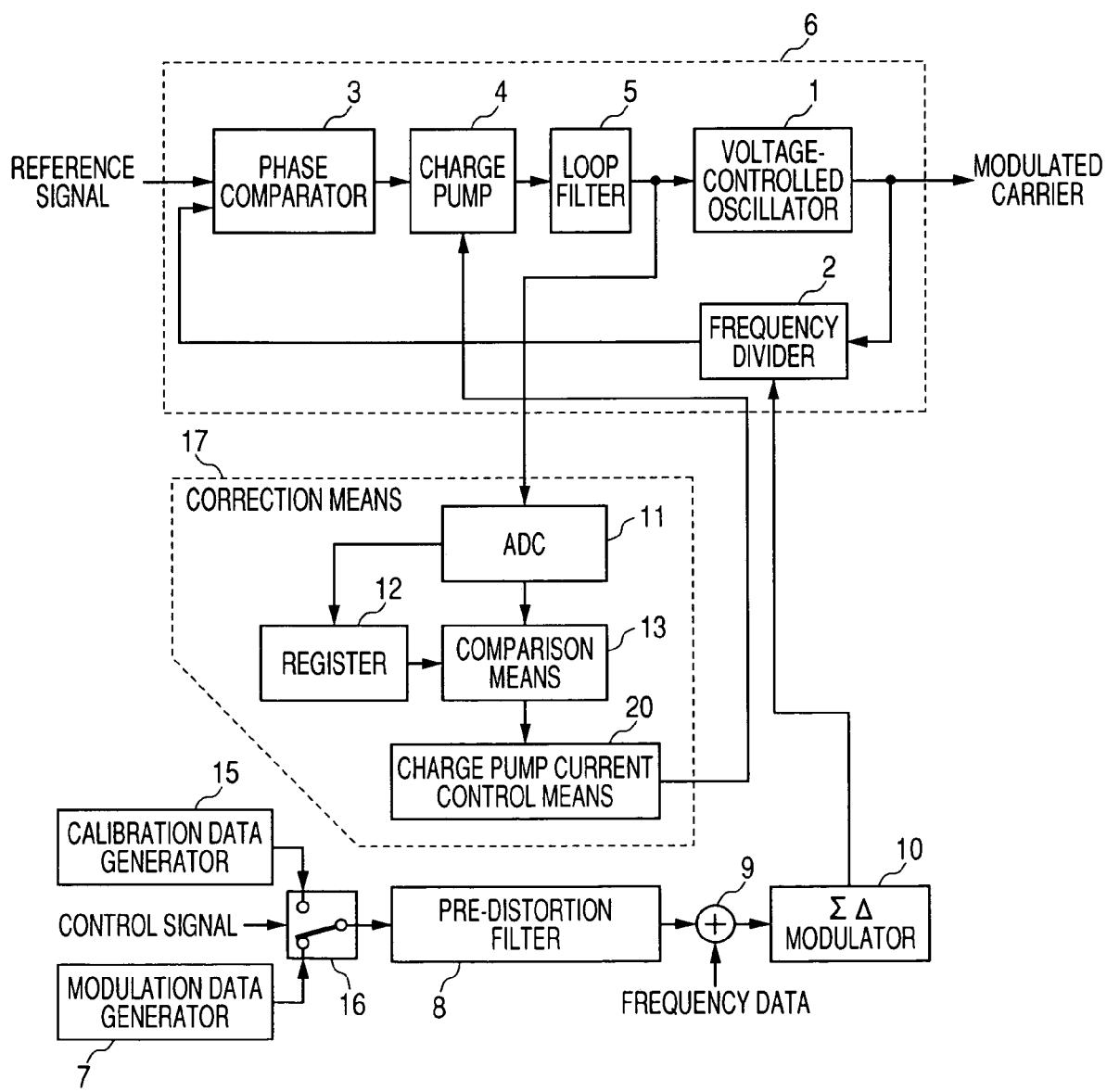
FIG. 9 is a block diagram showing the configuration of a wideband modulator using a PLL frequency synthesizer according to a third embodiment of the invention.

FIG. 9 is a block diagram showing the configuration of a wideband modulator using a PLL frequency synthesizer according to a third embodiment of the invention.

The third embodiment comprises a charge pump current control means for controlling the current gain of a charge pump 4 in accordance with the output of the comparison means 13 instead of a filter characteristic control means 14. In this case, the charge pump 4 is a current output type. Other components are same as those in the second embodiment shown in FIG. 4.

In the third embodiment, a calibration data generator 15 outputs a signal having a frequency (fBW in this example) corresponding to the modulation bandwidth as shown in FIG. 6. Comparison means 13 compares the output of an A/D converter 11 and that of a register 12 and outputs a comparison result, same as the second embodiment.

Figure 10:
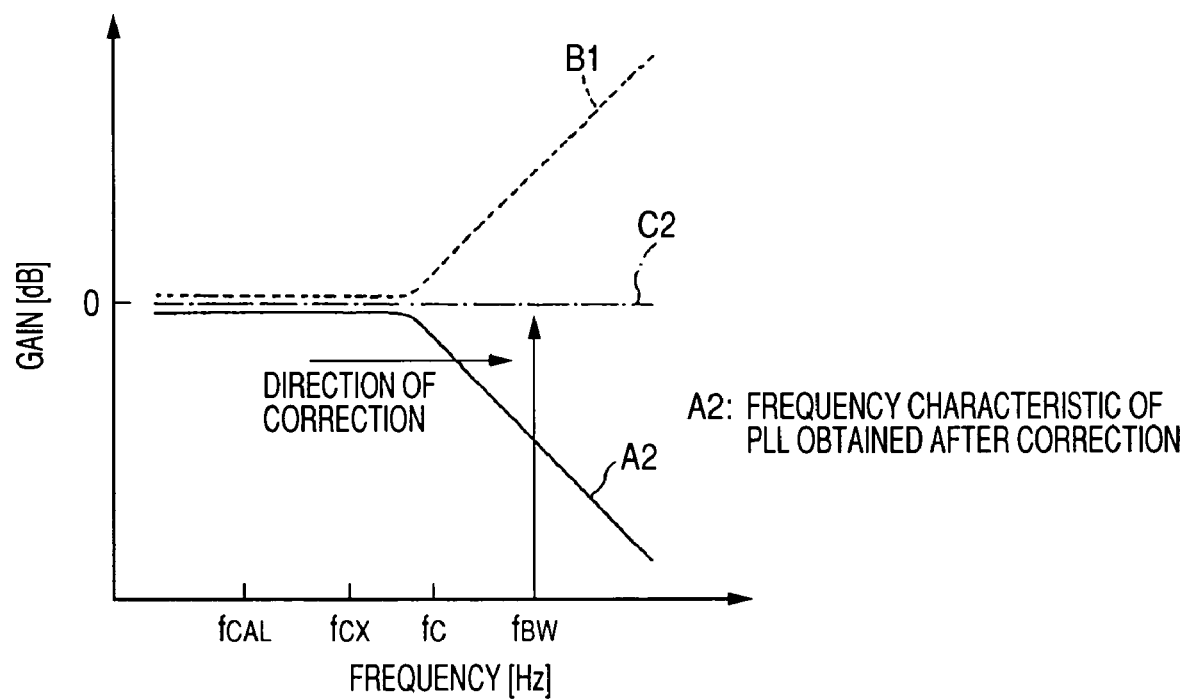
FIG. 10 is a frequency characteristic graph which illustrates the operation in the modulator according to the third embodiment.

Varying the current gain of the charge pump 4 can vary the frequency characteristic of a PLL 6. Charge pump current control means 20 varies the current gain of the charge pump 4 so that the comparison result output from the comparison means 13 will be 0, thereby correcting the frequency characteristic of the PLL 6. As a result, as shown in FIG. 10, calibration is complete when the comparison result has reached 0. The calibration control signal is used to input a modulating signal output from a modulation data generator 7 to a pre-distortion filter 8. By synthesizing the frequency characteristic A2 of the PLL 6 after correction and the frequency characteristic B1 of the pre-distortion filter 8, the frequency characteristic C2 after synthesis is flattened.

In this way, according to the third embodiment, even in the presence of a variation in the PLL band, the frequency characteristic of a PLL is varied by controlling the current of a charge pump in order to correct the variation. This prevents degradation in the modulation accuracy.

Reduction of a circuit scale through fixed characteristic of the pre-distortion filter 8 is more advantageous than increase in the number of circuits to vary the current gain of the charge pump 4. This reduces the overall cost through circuit downsizing.

While the output of a loop filter 5 is converted to a digital value by way of the A/D converter 11 and a signal is generated which controls the charge pump 4 by using the register 12, the comparison means 13, and the charge pump current control means 20, another configuration may be employed as long as correction means having the same functionality is used.

The charge pump current control means 20 may comprise a ROM storing control data used to vary the current gain of the charge pump 4. This facilitates control of the charge pump 4 and reduces the circuit scale, thereby reducing the overall cost.

A modulator according to the invention may comprise both the charge pump current control means 20 of the third embodiment and the filter characteristic control means 14 of the second embodiment which respectively control the current gain of the charge pump 4 and the cutoff frequency of the pre-distortion filter 8.

In this case, it is possible to simultaneously vary the frequency characteristic of a PLL and that of a pre-distortion filter. This improves the calibration accuracy thereby improving the modulation accuracy.

Even in case a signal other than one having a single tone, such as a modulating signal is used as a calibration signal, correction means may be provided which is capable of varying the current gain of the charge pump 4 by using the output signal of the loop filter 5, in order to obtain the same effect.

(Fourth Embodiment)

Figure 11:
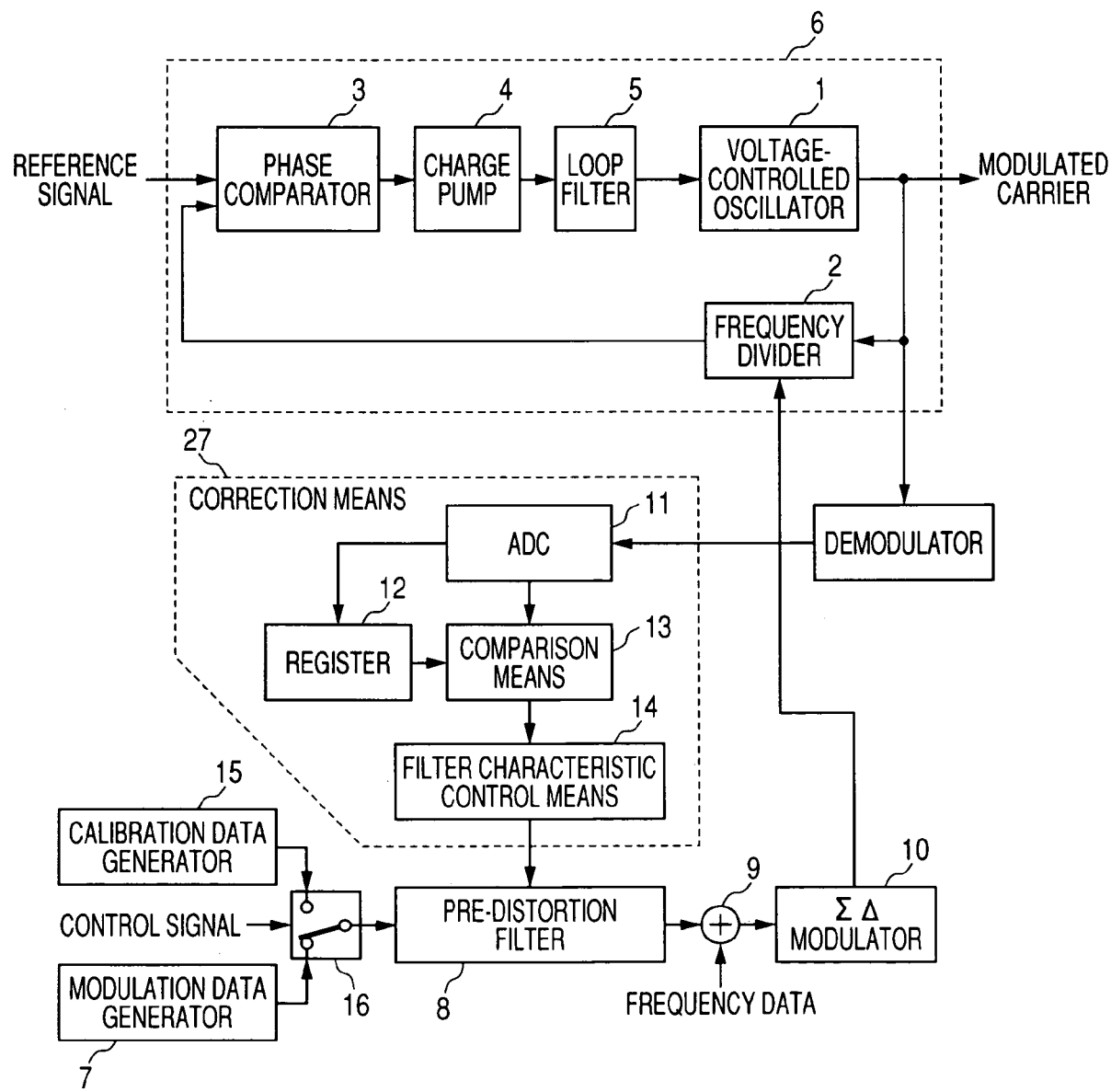
FIG. 11 is a block diagram showing the configuration of a wideband modulator using a PLL frequency synthesizer according to a fourth embodiment of the invention.

FIG. 11 is a block diagram showing the configuration of a wideband modulator using a PLL frequency synthesizer according to a fourth embodiment of the invention.

The fourth embodiment comprises a demodulator 18 for demodulating the output signal of a VCO 1 instead of using the output signal of a loop filter 5 as an input to an A/D converter 11. This embodiment uses the output of the demodulator 18 as an input to the A/D converter 11. Other components are same as those in the second embodiment shown in FIG. 4.

In the fourth embodiment, a calibration signal can be demodulated by the demodulator 18. By inputting the demodulated signal to the A/D converter 11, calibration is performed, same as the second embodiment.

After the characteristic of the pre-distortion filter is varied and calibration is over, operation of the A/D converter 11 may be halted until frequency data is updated next. This assures lower power consumption.

In this way, according to the fourth embodiment, even in the presence of a variation in the frequency characteristic of a PLL, the cutoff frequency of the pre-distortion filter 8 is varied to correct the variation. This prevents degradation in the modulation accuracy.

In the third embodiment shown in FIG. 9, a demodulator 18 for demodulating the output signal of the VCO 1 may be provided instead of using the output signal of the loop filter 5 as an input to the A/D converter 11, in order to obtain the same effect.

(Fifth Embodiment)

Figure 12:
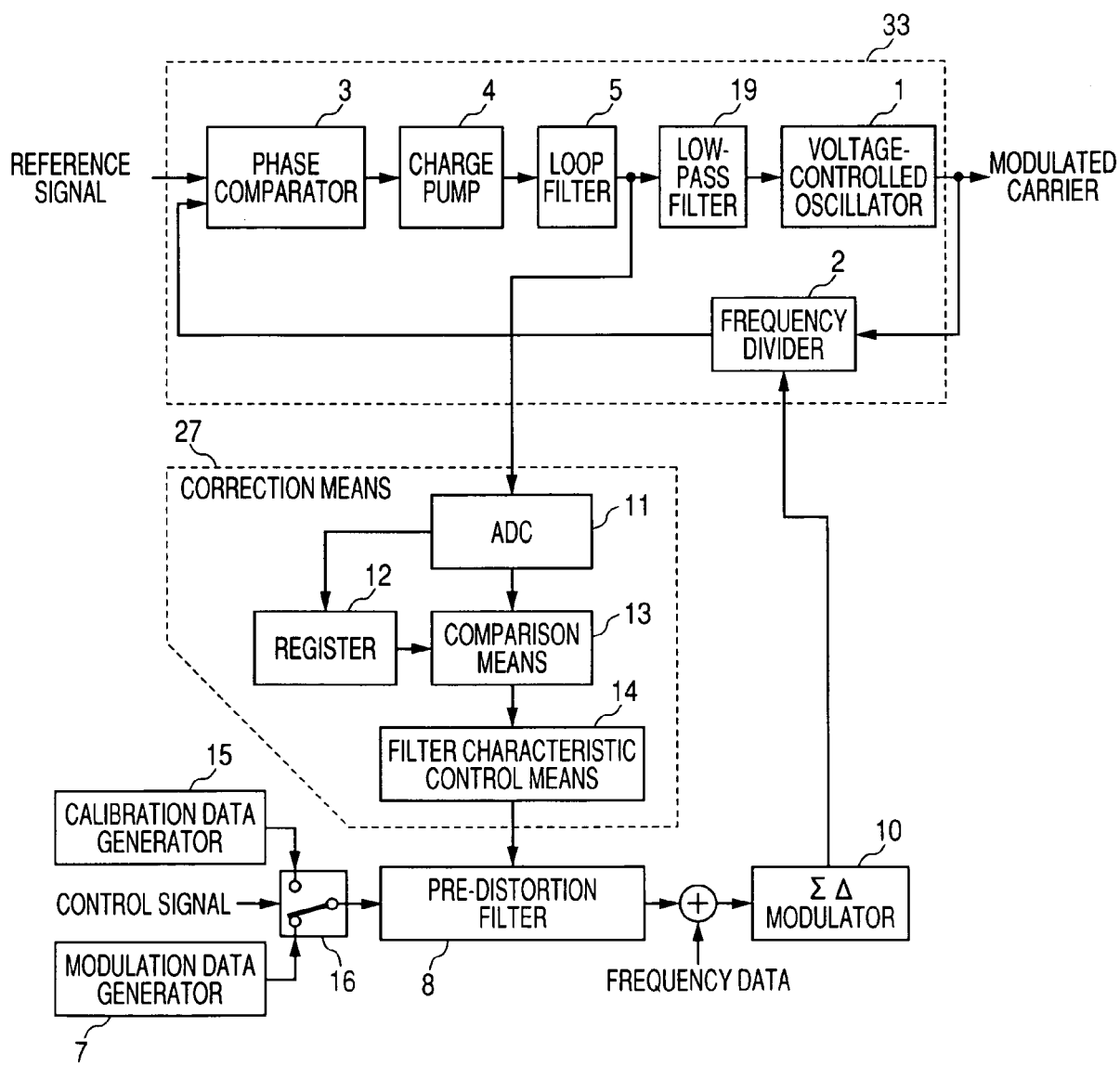
FIG. 12 is a block diagram showing the configuration of a wideband modulator using a PLL frequency synthesizer according to a fifth embodiment of the invention.

FIG. 12 is a block diagram showing the configuration of a wideband modulator using a PLL frequency synthesizer according to a fifth embodiment of the invention.

In the fifth embodiment, a PLL 33 comprises a low-pass filter 19. The PLL 33 directs the output of a loop filter 5 to the frequency control terminal of a VCO 1 via the low-pass filter 19. Other components are same as those in the second embodiment shown in FIG. 4.

A pre-distortion filter 8 has a frequency characteristic inverse to that of the loop filter 5, same as the second embodiment. The cutoff frequency of the low-pass filter 19 is higher than the modulation band.

Figure 13:
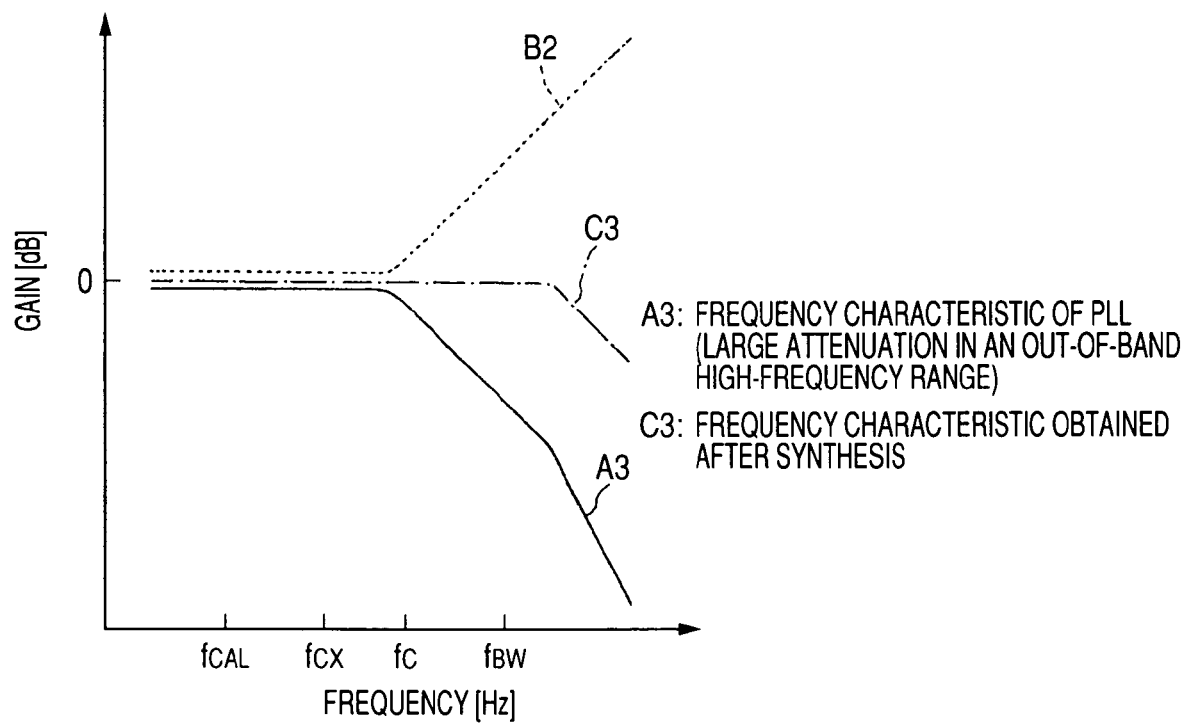
FIG. 13 is a frequency characteristic graph which illustrates the operation in the modulator according to the fifth embodiment.
Figure 14:
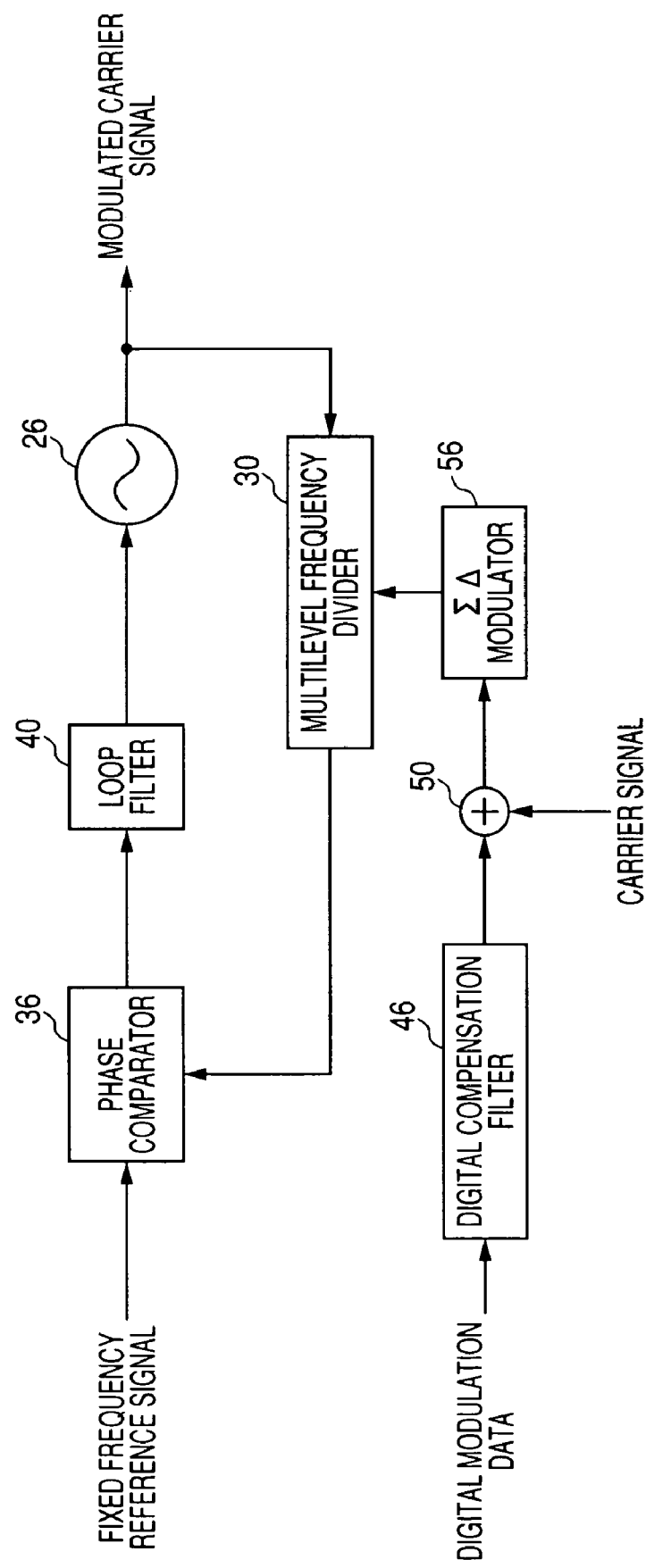
FIG. 14 is a block diagram showing an exemplary configuration of a wideband modulator using a PLL frequency synthesizer according to the related art.

FIG. 13 shows a frequency characteristic of the modulator according to the fifth embodiment. The frequency characteristic A3 of the PLL 33 is synthesized with the characteristic of the low-pass filter 19 so that the attenuation slop becomes steep as the frequency fBW in the modulation band is exceeded. Thus, the frequency characteristic C3 obtained after synthesis with the frequency characteristic B2 of the pre-distortion filter 8 shows an increase in the attenuation volume past fBW.

In this way, according to the fifth embodiment, the PLL 33 comprises the low-pass filter 19, which improves the noise characteristic in a frequency band higher than the modulation band.

The same effect is obtained by adding the low-pass filter 19 to each of the first through fourth embodiments.

As mentioned above, according to this embodiment, even in the presence of a variation in the frequency characteristic due to a variation in the manufacture of circuit components, a flat gain characteristic is provided even in a frequency band exceeding the cutoff frequency of the PLL by varying and correcting the frequency characteristic of at least one of a PLL and a pre-distortion filter. This prevents degradation in modulation accuracy even in the presence of a variation in the manufacture of circuit components, thereby allowing high-accuracy wideband modulation.

While the invention has been described in detail and referring to specific embodiments, those skilled in the art will recognize that various changes and modifications can be made in it without departing from the spirit and scope thereof This patent application is based on Japanese Patent Application No. 2003-002501, the disclosure of which is incorporated herein by reference.

INDUSTRIAL APPLICABILITY

As mentioned hereinabove, according to the invention, it is possible to provide a modulator capable of performing wideband modulation which can prevent degradation in the modulation accuracy even in the presence of a variation in the manufacture of circuit components.

The invention claimed is:

1. A modulator comprising:
a PLL including a voltage-controlled oscillator, a frequency divider and a phase comparator,
said modulator generating a modulating signal based on the modulation data having information on a wider bandwidth than the frequency bandwidth of the PLL, setting the division ratio of said frequency divider by way of this modulating signal, and outputting a modulated carrier signal from said voltage-controlled oscillator as well as performing filtering processing by way of a pre-distortion filter on said modulation data to provide a frequency characteristic inverse to the frequency characteristic of said PLL in a process of generating said modulation signal, thereby allowing wideband modulation,
wherein said modulator comprises:
error detection means for detecting a difference between an amplitude value in a frequency equal to or below the cutoff frequency of said PLL and an amplitude value in a frequency higher than said cutoff frequency concerning an ac component of said modulating signal appearing on a control terminal of said voltage controlled oscillator, and
frequency characteristic correction means for correcting at least one of the frequency characteristic of said PLL and the frequency characteristic of said pre-distortion filter in a direction said detected difference is eliminated.

2. The modulator according to claim 1, said modulator comprising a selector for selectively inputting, as said modulation data, first calibration data on a frequency equal to or below the cutoff frequency of said PLL and second calibration data on a frequency above the cutoff frequency of said PLL.

3. A modulator comprising:
a PLL including,
a voltage-controlled oscillator for outputting a modulated carrier signal,
a frequency divider for dividing the frequency of an output signal of said voltage controlled oscillator by a modulated division ration,
a phase comparator for comparing the phase of the output signal of said frequency divider and the phase of a reference signal and outputting the phase difference,
a charge pump for converting the output signal of said phase comparator to a voltage or a current, and
a loop filter for performing low pass filtering of the output signal of said charge pump and outputting the resulting signal to said voltage controlled oscillator;
a modulation data generator for generating and outputting modulation data having the information on a wider bandwidth than the bandwidth of said PLL;
a pre-distortion filter which has a characteristic inverse to the frequency characteristic of said PLL approximated and which filters said modulation data;
division ratio modulation means for modulating the output signal of said pre-distortion filter and outputting the resulting output signal as a modulating signal used to set the division ratio of said frequency divider; and
a pre-distortion filter frequency characteristic correction means for outputting a control signal for varying the frequency characteristic of said pre-distortion filter.

4. The modulator according to claim 3, said modulator comprising:
a calibration data generator for generating and outputting, to said pre-distortion filter, first calibration data having the frequency information on the frequency band of said PLL and
second calibration data having the frequency information on the band outside the frequency band of said PLL, wherein said pre-distortion filter frequency characteristic correction means comprises:

an A/D converter for converting to a digital signal the amplitude value of an ac component having the division ratio modulated by said division ratio modulation means appearing on the output of said loop filter in response to said first and second calibration data respectively;

comparison means for comparing the data of said two amplitude values output from said A/D converter and outputting the difference information; and filter characteristic control means for varying the characteristic of said predistortion filter in accordance with said difference information output from said comparison means.

5. The modulator according to claim 3, said modulator comprising:

a calibration data generator for generating and outputting, to said predistortion filter, first calibration data having the frequency information on the frequency band of said PLL and second calibration data having the frequency information on the band outside the frequency band of said PLL and a demodulator for demodulating the output signal of said voltage-controlled oscillator, wherein said predistortion filter frequency characteristic correction means comprises:

an A/D converter for converting to a digital signal the amplitude value of an ac component having the division ratio modulated by said division ratio modulation means appearing on the output of said loop filter in response to said first and second calibration data respectively;

comparison means for comparing for comparing the data of said two amplitude values output from said A/D converter and outputting the difference information; and filter characteristic control means for varying the characteristic of said pre-distortion filter in accordance with said difference information output from said comparison means.

6. The modulator according to claim 3, wherein said filter characteristic control means comprises a memory for storing control data used to change the frequency characteristic of said pre-distortion filter.

7. The modulator according to claim 4 or 5, wherein, in said pre-distortion filter frequency characteristic correction means, said comparison means compares the amplitude values of an ac component having the division ratio modulated by said division ratio modulation means appearing on the output of said loop filter in response to said first and second calibration data respectively, immediately after varying the output frequency of said voltage-controlled oscillator, and said filter characteristic control means varies the characteristic of said pre-distortion filter in accordance with said comparison result.

8. The modulator according to claim 4 or 5, wherein said modulator halts the operation of said A/D converter after varying the characteristic of said pre-distortion filter.

9. The modulator according to claim 5, wherein said modulator halts the operation of said demodulator after varying the characteristic of said predistortion filter.

10. A modulator comprising:

a PLL including, a voltage-controlled oscillator for outputting a modulated carrier signal, a phase comparator for comparing the phase of the output signal of said frequency divider and the phase of a reference signal and outputting the phase difference, a charge pump for converting the output signal of said phase comparator to a voltage or a current, and a loop filter for performing low-pass filtering of the output signal of said charge pump and outputting the resulting signal to said voltage-controlled oscillator;

a modulation data generator for generating and outputting modulation data having the information on a wider bandwidth than the bandwidth of said PLL;

a pre-distortion filter which has a characteristic inverse to the frequency characteristic of said PLL approximated and which filters said modulation data; division ratio modulation means for modulating the output signal of said predistortion filter and outputting the resulting output signal as a modulating signal used to set the division ratio of said frequency divider; and a PLL frequency characteristic correction means for outputting a control signal for varying the current gain of said charge pump.

11. The modulator according to claim 10, said modulator comprising:

a calibration data generator for generating and outputting, to said pre-distortion filter, first calibration data having the frequency information on the frequency band of said PLL and second calibration data having the frequency information on the band outside the frequency band of said PLL, wherein said PLL frequency characteristic correction means comprises:

an A/D converter for converting to a digital signal the amplitude value of an ac component having the division ratio modulated by said division ratio modulation means appearing on the output of said loop filter in response to said first and second calibration data respectively;

comparison means for comparing the data of said two amplitude values output from said A/D converter and outputting the difference information; and charge pump current control means for varying the current gain of said charge pump in accordance with said difference information output from said comparison means.

12. The modulator according to claim 10, said modulator comprising:

a calibration data generator for generating and outputting, to said pre-distortion filter, first calibration data having the frequency information on the frequency band of said PLL and second calibration data having the frequency information on the band outside the frequency band of said PLL and a demodulator for demodulating the output signal of said voltage-controlled oscillator, wherein said PLL frequency characteristic correction means comprises:

an A/D converter for converting to a digital signal the amplitude value of an ac component having the division ratio modulated by said division ratio modulation means appearing on the output of said loop filter in response to said first and second calibration data respectively;

comparison means for comparing the data of said two amplitude values output from said A/D converter and outputting the difference information; and charge pump current control means for varying the current gain of said charge pump in accordance with said difference information output from said comparison means.

13. The modulator according to claim 10, wherein said charge pump current control means comprises a memory for storing control data used to change the frequency characteristic of said PLL.

14. The modulator according to claim 3 or 10, wherein a low-pass filter is provided having a higher cutoff frequency than the bandwidth of said modulating signal between the output end of said loop filter and the input end of said voltage-controlled oscillator.

15. The modulator according to claim 3 or 10, wherein said pre-distortion filter is an IIR-type digital filter.

16. The modulator according to claim 4 or 11, wherein said loop filter and said A/D converter are ac coupled with each other.

17. The modulator according to any one of claims 4, 5, 11 or 12, wherein said first and second calibration data have a single frequency information item.

18. A mobile radio unit comprising the modulator according to claim 1, 3 or 10.

19. A radio base station comprising the modulator according to claim 1, 3 or 10.

20. A method for correcting a modulator which generates a modulating signal based on the modulation data having information on a wider bandwidth than the frequency bandwidth of the PLL, sets the division ratio of said frequency divider by way of this modulating signal, and outputs a modulated carrier signal from said voltage-controlled oscillator as well as performs filtering processing by way of a pre-distortion filter on said modulation data to provide a frequency characteristic inverse to the frequency characteristic of said PLL in a process of generating said modulation signal, thereby allowing wideband modulation, wherein said method comprises an error detecting step of detecting a difference between an amplitude value in a frequency equal to or below the cutoff frequency of said PLL and an amplitude value in a frequency higher than said cutoff frequency concerning an ac component of said modulating signal appearing on a control terminal of said voltage controlled oscillator, and a frequency characteristic correcting step of correcting at least one of the frequency characteristic of said PLL and the frequency characteristic of said pre-distortion filter in a direction said detected difference is eliminated.

* * * * *